(12) United States Patent
Reifenberg

(10) Patent No.: US 11,570,913 B2
(45) Date of Patent: Jan. 31, 2023

(54) DOOR HANDLE FOR A VEHICLE

(71) Applicant: MERCEDES-BENZ GROUP AG, Stuttgart (DE)

(72) Inventor: Bernd Reifenberg, Essen (DE)

(73) Assignee: MERCEDES-BENZ GROUP AG, Stuttgart (DE)

( * ) Notice: Subject to any disclaimer, the term of this patent is extended or adjusted under 35 U.S.C. 154(b) by 156 days.

(21) Appl. No.: 16/952,441

(22) Filed: Nov. 19, 2020

(65) Prior Publication Data

US 2021/0195768 A1 Jun. 24, 2021

(30) Foreign Application Priority Data

Dec. 23, 2019 (DE) ...................... 10 2019 135 774.8

(51) Int. Cl.
*E05B 41/00* (2006.01)
*E05B 79/06* (2014.01)
(Continued)

(52) U.S. Cl.
CPC ........... *H05K 5/0069* (2013.01); *E05B 41/00* (2013.01); *E05B 79/06* (2013.01); *E05B 81/77* (2013.01);
(Continued)

(58) Field of Classification Search
CPC ...... H05K 5/0069; H05K 5/063; H05K 5/064; E05B 41/00; E05B 79/06; E05B 81/77;
(Continued)

(56) References Cited

U.S. PATENT DOCUMENTS

| 7,375,299 B1 * | 5/2008 | Pudney | .................... E05B 81/78 200/61.62 |
|---|---|---|---|
| 8,601,903 B1 * | 12/2013 | Klein | ...................... E05B 81/78 74/543 |
| 2010/0321946 A1 * | 12/2010 | Dingman | ................. B60Q 1/26 362/501 |

FOREIGN PATENT DOCUMENTS

| DE | 10232583 A1 | 2/2003 |
|---|---|---|
| DE | 102016116885 A1 | 3/2018 |

(Continued)

OTHER PUBLICATIONS

Extended European Search Report for European Application No. 20215463.9 dated Jun. 8, 2021, with its English summary, 12 pages.

*Primary Examiner* — Christine M Mills
*Assistant Examiner* — Thomas L Neubauer
(74) *Attorney, Agent, or Firm* — Patent Portfolio Builders PLLC

(57) ABSTRACT

The invention concerns a door handle (10) for a vehicle (1), in particular an external door handle (10) for a movable part (2) of the vehicle (1), comprising:
 a cavity (11) which is at least partially formed by a housing (12) of the door handle (10), and
 an electronic unit (20), which is received in the cavity (11),
wherein the electronic unit (20) comprises a carrier unit (21), in particular an electric circuit board, such as a printed circuit board or a printed circuit,
 an electric connector unit (30) which comprises at least one electrically conductive connector element (31), in particular comprising at least one contact pin,
wherein the at least one connector element (31) is fixed, in particular soldered, welded or glued, to the carrier unit (21) in a material-locking manner.

19 Claims, 7 Drawing Sheets

Figure 1:
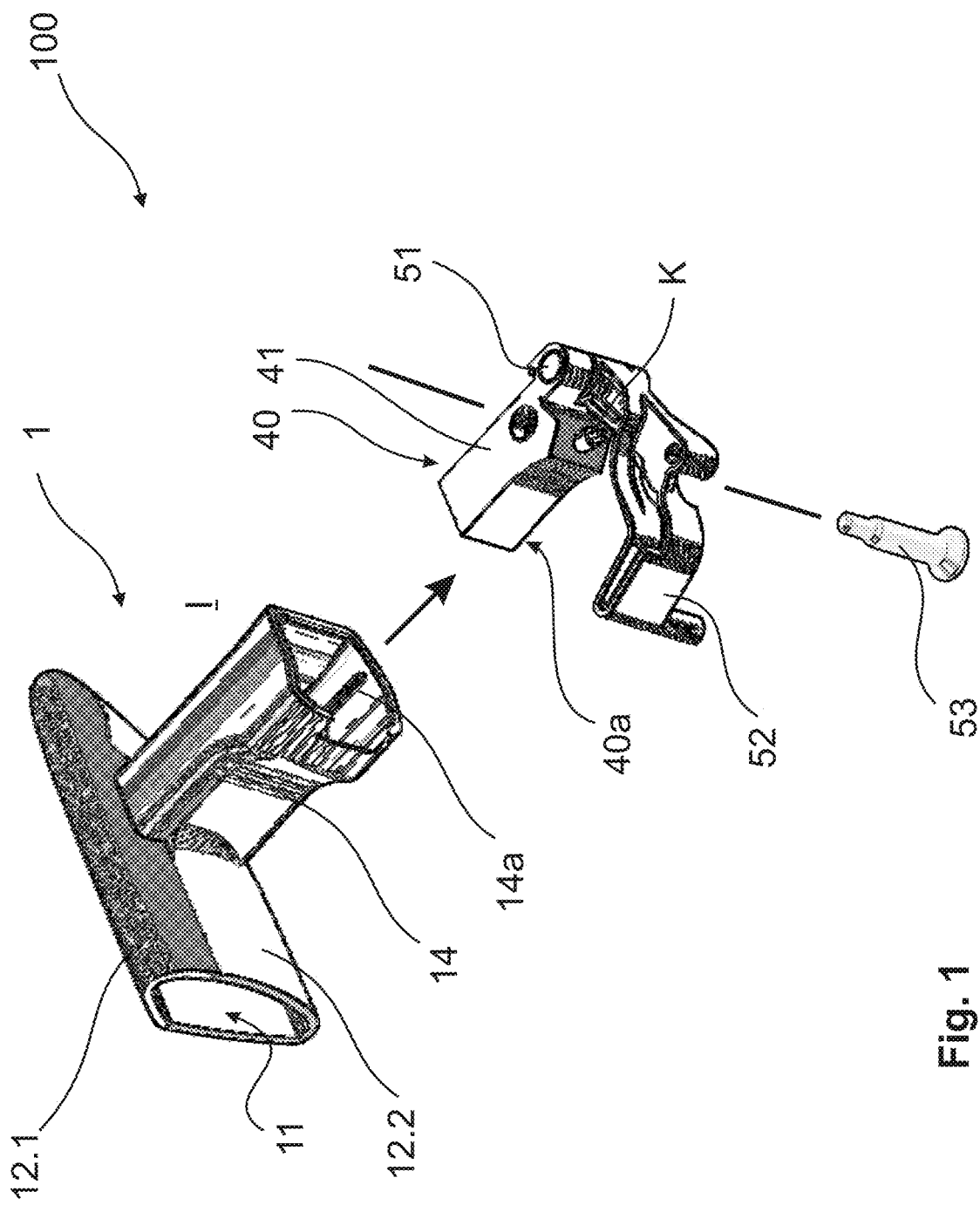

(51) Int. Cl.
*E05B 81/76* (2014.01)
*H05K 5/00* (2006.01)
*F21S 43/19* (2018.01)
*E05B 85/10* (2014.01)
*F21W 107/10* (2018.01)
*B60R 16/03* (2006.01)
*H05K 5/06* (2006.01)

(52) U.S. Cl.
CPC .......... *E05B 85/107* (2013.01); *F21S 43/195* (2018.01); *B60R 16/03* (2013.01); *F21W 2107/10* (2018.01); *H05K 5/063* (2013.01); *H05K 5/064* (2013.01)

(58) Field of Classification Search
CPC .. E05B 85/107; E05B 17/0004; E05B 85/103; E05B 85/16; E05B 81/76; E05B 85/10; E05B 81/54; E05B 81/64; F21S 43/195; B60R 16/03; F21W 2107/10; H01R 13/02; H01R 13/73
See application file for complete search history.

(56) References Cited

FOREIGN PATENT DOCUMENTS

| | | |
|---|---|---|
| EP | 1306503 A1 | 5/2003 |
| EP | 3578740 A1 | 12/2019 |

\* cited by examiner

DOOR HANDLE FOR A VEHICLE

The present invention relates to a door handle for a vehicle, in particular a motor vehicle. Furthermore, the invention relates to a handle arrangement for a vehicle. Moreover, the invention relates to a method for producing a handle arrangement.

Door handles for vehicles are known from the prior art, which usually comprise additional electronic components within a cavity of the door handle. The electronic components are used to detect an actuation of the door handle, for example an approach and/or a touch. Depending on the detection of the actuation, a security system, especially a locking system, of the vehicle is usually activated. In order to provide this functionality, the electronic components in the door handle must be connected to the vehicle electronics outside the door handle.

For this purpose, the electronic component, for example a circuit board with electronic components, is usually inserted into the cavity of the door handle with a cable attached to it during mounting. The cable is then led out of the cavity of the door handle through an opening of the door handle in order to be electronically connected, for example by means of a plug connection, to an electronic system in the vehicle.

However, this has the disadvantage that the production of the door handle is very costly and complicated to perform. Especially the leading of the electric cable out of the cavity is a difficult task, which can only be done manually and is very time consuming. At the same time, the demands on the positioning and/or fixing of the circuit board or the cable connected to the circuit board increase in order to ensure a reliable electric connection and thus a functionality of the door handle.

It is therefore an object of the present invention to at least partially overcome the disadvantages described above, in particular to provide an improved door handle for a vehicle. Furthermore, it is an object of the present invention to provide a low-cost door handle, a door handle which is easy to assemble and a door handle which is easy to mount on the vehicle. Furthermore, it is an object of the invention to provide a corresponding improved handle arrangement for a vehicle. Furthermore, it is an object of the invention to provide an improved method for the production of a handle arrangement, wherein the production of the handle arrangement comprises the mounting of the door handle and the mounting of the door handle on the vehicle by means of a bearing coupling, and wherein the method can be performed easily, quickly and with little effort.

The preceding object is solved by a door handle with the features of the independent device claim, a handle arrangement with the features of the secondary independent device claim and a method with the features of the independent method claim. Further features and details of the invention result from the respective dependent claims, the description and the figures. Features and details described in connection with the door handle according to the invention and/or with the handle arrangement according to the invention are, of course, also valid in connection with the method according to the invention, and vice versa, so that with regard to disclosure, reference is or can always be made to the individual aspects of the invention.

The object described above is solved by a door handle for a vehicle, preferably a motor vehicle, in particular an external door handle for a movable part of the vehicle, comprising:

a cavity which is at least partially formed by a housing of the door handle, and an electronic unit, which is received in the cavity, wherein the electronic unit comprises a carrier unit, in particular an electric circuit board, such as a printed circuit board or a printed circuit, an electric connector unit which comprises at least one electrically conductive connector element, in particular comprising at least one contact pin, wherein the at least one connector element is fixed, in particular soldered, welded or glued, to the carrier unit in a material-locking manner.

The door handle can preferably be designed as a flush door handle, which can be moved out of the outside of the movable part to reach an operating position. In the operating position, the door handle serves to actuate the movable part. For actuation, e.g. a force can be exerted on the door handle, in particular pulling and/or pushing, so that the movable part can be unlocked and/or moved. The door handle can be specially designed for a keyless-entry and/or keyless-go security system.

The carrier unit in the sense of the invention may serve to receive electronic components such as electrical resistors and/or capacitors and/or coils. Likewise, the carrier unit can also receive at least one microprocessor and/or an integrated circuit and/or one or more sensor units and/or one or more conductor tracks.

According to the invention, the carrier unit comprises at least one electrically conductive connector element in the form of at least one contact pin, which is connected to the carrier unit in a material-locking manner, in particular by soldering, welding or gluing.

Thus, the at least one electrically conductive connector element together with the electric connector unit can form a male plug part, which is integrated in the door handle. Thus, it is possible to provide the door handle without a cable. After arranging the door handle from the outside on the vehicle, especially on the movable part of the vehicle, a separate socket can be led to the connector element from the inside with respect to the vehicle or from the inside with respect to the movable part of the vehicle, which can be mechanically fixed to the electric connector unit and at the same time electrically connected with the at least one electrically conductive connector element. The socket can in turn be equipped with a cable which can lead to an electronic system of the vehicle and/or which can lead to a further plug. Thus, the mounting of the door handle on the vehicle, in particular on the movable part of the vehicle, as well as the interconnection of the electronic unit with the electronic system of the vehicle can be simplified considerably.

In addition, with the door handle according to the invention, it is not necessary to handle the electric connector unit with a cable from the onset, e.g. when producing the door handle, i.e. when inserting the electronic unit into the cavity. The mounting and/or arrangement and/or positioning of the electronic unit, in particular the carrier unit, within the cavity of the door handle is thus considerably simplified. Advantageously, a simple mounting of the door handle, also fully automatically by a robot, can be enabled.

In the context of the invention, an electric connection in the context of the invention is understood to mean that an electric signal connection is established and/or an electric energy transmission can occur. For example, an electric connection between two elements exists if there is an electrically conductive connection between these two elements, e.g. via a conductor track. Accordingly, it is not inevitably necessary for an electric connection that the electrically connected elements are physically directly connected to each other.

Furthermore, the invention may provide that the electric connector unit and/or the electronic unit are/is designed to be wireless. Thus, the handling of the electric connector unit and/or the electronic unit during the mounting and/or arrangement and/or positioning within the cavity of the door handle or the assembly of the door handle can be considerably simplified. After assembling the door handle, a finished wireless door handle can be guided from the outside to the movable part of the vehicle to be mounted on a bearing coupling that can be guided from the inside to the movable part of the vehicle. The bearing coupling may in turn comprise an electric line, in particular a cable, which can be mechanically fixed to the electric connector unit, in particular detachably, preferably in a form- and/or force-locking manner, preferably by an engaging connection, whereby the electronic unit can be electrically connected to the electric line, in particular the cable, of the bearing coupling.

Furthermore, the invention may provide that the carrier unit is designed as an electric circuit board, in particular in the form of a printed circuit board or a printed circuit. Thus, an electronic unit with advantageous functionality can be provided.

Within the scope of the invention, it is also conceivable that the carrier unit comprises at least one conductor track and/or at least one sensor unit which are/is electrically connectable to a socket via the at least one connector element. Thus, an actuation of the door handle, for example an approach and/or a touch, can be enabled by means of the electronic unit.

Furthermore, it is advantageous within the scope of the invention that the at least one conductor track and/or the at least one sensor unit is designed in the form of a proximity sensor, in particular a capacitive sensor. In this way, a functionality of the door handle can be enabled within the framework of a keyless-entry and/or a keyless-go security system of the vehicle.

Furthermore, the invention may provide that the electronic unit comprises at least one lighting unit which is electrically connectable to a socket via the at least one connector element. Thus, the door handle can provide further advantageous functions if the lighting unit signals by certain colors and/or generally by emitting light certain actuation states of a keyless-entry and/or keyless-go security system of the vehicle and/or indicates the actuation, such as unlocking and/or opening of the movable part. It is also conceivable that the lighting unit may be designed to emit warning signals if, for example, the at least one sensor unit senses that the user and/or other obstacles, such as curbs, or objects, such as a tree or tree root, are too close to the movable part, so that a safe opening of the movable part is not possible.

Further, the invention may provide that the door handle is designed as a flush door handle, and is preferably movable from a rest position, wherein in the rest position an outer surface of the door handle is substantially flush with an outside of the movable part, to an operating position, in particular by a parallel movement of the outer surface of the door handle to the outside of the movable part, wherein in the operating position the door handle can be manually actuated, e.g. by pulling the door handle and/or pushing the door handle. Thus, a pleasant appearance and improved aerodynamics can be provided on the vehicle in the region of the flush door handle. At the same time, a retractable door handle allows for a familiar and comfortable actuation of the movable part.

Furthermore, the invention can provide that the electric connector unit comprises a connector housing, wherein in particular in the connector housing a receptacle for the at least one connector element is formed so that the at least one connector element can be electrically contacted with an electric line, in particular a cable, of the bearing coupling by mechanically connecting the connector housing with a socket of a bearing coupling. In this way, a simple mounting of the door handle on the vehicle and a comfortable attachment of the electronic unit with the vehicle electronics can be ensured.

Furthermore, the invention can provide that a connector housing of the electric connector unit comprises at least one securing element in order to connect the connector housing to a socket of a bearing coupling in a form- and/or force-locking manner, wherein in particular the at least one securing element is designed in the form of a latch, a latch hook or an undercut for a complementary counter-securing element on a socket of a bearing coupling. In this way, a mechanical as well as an electric attachment of the electric connector unit to the socket of a bearing coupling can be performed simply, conveniently and purposefully until the securing element of the electric connector unit engages with the complementary counter-securing element of the bearing coupling. A final mounting position of the door handle on the bearing coupling can thus be signaled haptically by engaging the securing element of the electric connector unit on the complementary counter-securing element of the bearing coupling.

Furthermore, the invention may provide that a connector housing of the electric connector unit, in particular at the at least one securing element, comprises a second elastic sealing element in particular in order to seal the cavity in addition to a first elastic sealing element. Thus, a sealed accommodation of the electronic unit in the cavity of the door handle can be ensured.

Furthermore, the invention may provide that a connector housing of the electric connector unit is designed as a plastic component, in particular as a two-component injection-molded part, preferably made of a fiber-plastic composite. Thus, a lightweight, low-cost component with improved properties can be provided which can be quickly produced in large quantities.

Advantageously, a connector housing of the electric connector unit can comprise at least one connector element as an injected element. Thus, the at least one connector element can lead from the cavity via the connector housing to the outside and serve for the electric connection with a vehicle electronics.

Furthermore, the invention may provide that the door handle comprises a bearing arm receptacle for a bearing coupling, which in particular comprises a completely closed circumferential contour for the bearing coupling, which is preferably adapted to the outer circumference of the bearing coupling, and which is preferably O-shaped or substantially rectangular. In this way, a simplified accommodation of the bearing coupling in a bearing arm of the door handle can be enabled. The bearing arm receptacle can be virtually formed by the bearing arm of the door handle.

Furthermore, the invention may provide that the bearing arm receptacle comprises a mounting element, in particular in the form of a guiding rail or a guiding engaging element, for a complementary counter-mounting element of the bearing coupling in order to receive the bearing coupling in a defined orientation in the bearing arm receptacle. In this way, mounting errors are reliably avoided. The door handle is always fixed to the movable part in the specified position with the help of the mounting element. The mounting element also ensures reliable electric contact between the electronic unit and the bearing coupling.

Furthermore, the invention can provide that the bearing arm receptacle is designed at such a distance from the outer contour of the electric connector unit that the electric connector unit is enclosed by the bearing arm receptacle in a shell-like manner, and that the bearing arm receptacle together with the connector unit forms a male plug part in which a socket of a bearing coupling can be detachably received, in particular in a form- and/or force-locking manner, and can be electrically contacted. In this way, an intuitive mounting of the socket of the bearing coupling in the bearing arm receptacle according to the plug and socket principle can be enabled.

In addition, the invention may provide that the door handle comprises a fixing unit for a connector housing of the electric connector unit in the region between the housing and a bearing arm receptacle for a bearing coupling. In this way, the electric connector unit can be fixed in a loss-proof and skidproof manner inside the door handle, so that the fixing of the door handle to the bearing coupling can be enabled, in particular via the electric connector unit.

Furthermore, the invention may provide that the fixing unit comprises a labyrinth guide which preferably cooperates with a complementary peripheral shoulder of the electric connector unit. By means of the labyrinth guide, an easy fixing of the electric connector unit in the housing can be enabled, whereby the correct mounting movement and mounting position is determined by the labyrinth guide. The labyrinth guide can also be used to seal the cavity.

It is also conceivable that the fixing unit may comprise an additional sealing, in particular within the labyrinth guide, to seal the cavity. In this way, the sealing of the cavity and in particular of the electronic unit within the door handle can be significantly improved.

Furthermore, it is conceivable that the fixing unit preferably extends along an outer circumference of the connector housing of the electric connector unit. In this way, the electric connector unit can close off the bearing receptacle virtually like a stopper. With an additional sealing effect of the fixing unit, a reliable sealed cavity can be created within the door handle.

It is also conceivable that the housing of the door handle comprises a first shell and a second shell. This allows an easy mounting and/or arrangement and/or positioning of the electronic unit, in particular the carrier unit, within the cavity of the door handle in one of the shells, wherein the other shell is subsequently fixed to the first shell to form the cavity.

It is also conceivable that the housing comprises at least one positioning element, in particular in the form of a positioning rail, for the carrier unit in order to fix the carrier unit in the cavity. In this way, the correct mounting and/or arrangement and/or positioning of the electronic unit, in particular the carrier unit, within the cavity of the door handle can be ensured.

It is also conceivable that the housing, in particular comprising a bearing arm receptacle for a bearing coupling and/or a fixing unit for a connector housing of the electric connector unit, is designed to seal the cavity, in particular to prevent a casting compound from escaping from the cavity. Thus, the casting compound can be poured into the cavity to protect the electronic unit even better.

In other words, it is conceivable that a casting compound is injected into the cavity in order to seal in particular the electronic unit, wherein preferably the casting compound surrounds the electronic unit predominantly or completely. The casting compound can be used to improve the sealing of the electronic unit.

Furthermore, the invention may provide that the housing of the door handle, in particular a first shell and a second shell, comprises an opening for injecting a casting compound into the cavity. Thus, a pouring of the casting compound into the cavity can be performed after the electronic unit has been arranged inside the cavity of the door handle and after one of the shells is closed with the other shell of the housing.

Furthermore, the invention can provide that the housing, in particular a bearing arm receptacle for a bearing coupling and/or a fixing unit for a connector housing of the electric connector unit, comprises a wall, in particular with a first elastic sealing element, wherein preferably the wall limits the cavity from a bearing arm receptacle for a bearing coupling, wherein preferably the at least one connector element extends through the wall from the cavity to a bearing arm receptacle for a bearing coupling. In this way, a sealing separation between the region inside the door handle or the cavity and the region outside the door handle can be enabled.

Furthermore, the invention may provide an aperture for the electronic unit, which is arranged in particular on an outside of the door handle, for example on a side facing away from the movable part, in order to shield at least one sensor unit of the electronic unit and/or to form a detection region of the at least one sensor unit. In this way, the functionality of the sensor unit can be improved.

In addition, it is conceivable that the aperture may be electrically conductive and/or metallic and/or formed as a coating, e.g. a chromium coating, on the outside of the door handle. Thus, a simple production of the aperture can be enabled.

It is also conceivable that the aperture may be electrically connected to the electric unit. In this way, the aperture can provide another sensor unit in the sense of the invention and/or can be connected to a certain potential. Thus, the functionality of the door handle according to the invention can be extended. For example, the aperture can be designed to detect an approach at a distance. Furthermore, it is conceivable that this aperture or a further aperture could be designed for detecting a touch, e.g. as part of an inductive sensor.

Furthermore, the object according to the invention is solved by a handle arrangement for a vehicle, comprising: a door handle, which can be designed as described above, and a bearing coupling for fixing the door handle on the vehicle, e.g. to a mounting carrier of the vehicle, wherein the bearing coupling is designed with an electric line, in particular a cable, and wherein the bearing coupling is mechanically, in particular detachably, preferably in a form- and/or force-locking manner, fixed and electrically connected to an electric connector unit of the door handle. Furthermore, the mounting carrier may comprise a central plug, which in turn may be electrically connected to the vehicle electronics. By means of the handle arrangement according to the invention, the same advantages can be achieved as described above in connection with the door handle according to the invention. These advantages are referred to in their entirety in the present case.

As already described above in connection with the door handle according to the invention, the door handle can comprise a bearing arm receptacle for the bearing coupling, which in particular comprises a completely closed circumferential contour for the bearing coupling, which is preferably adapted to the outer circumference of the bearing coupling, and which is preferably O-shaped or substantially rectangular. The bearing arm receptacle for the bearing coupling enables an intuitive mounting of the door handle to the bearing coupling.

Furthermore, the invention may provide that the bearing arm receptacle comprises a mounting element, in particular in the form of a guiding rail or a guiding engaging element, which cooperates with a complementary coupling element of the bearing coupling to receive the bearing coupling in a defined orientation in the bearing arm receptacle. This will ensure a correct mounting of the door handle to the bearing coupling.

Furthermore, the invention can provide that the bearing arm receptacle is designed at such a distance from the outer contour of the electric connector unit that the electric connector unit is enclosed by the bearing arm receptacle in a shell-like manner, and that the bearing arm receptacle together with the connector unit forms a male plug part in which a socket of the bearing coupling is detachably received, in particular in a form- and/or force-locking manner, and electrically contacted. Thus, errors during mounting can be safely avoided, because the electric connector unit can form a suitable counterpart for the socket of the bearing coupling within the bearing arm receptacle.

In addition, the invention can provide that a connector housing of the electric connector unit comprises at least one securing element in order to connect the connector housing to a socket of the bearing coupling in a form- and/or force-locking manner, wherein in particular the at least one securing element is designed in the form of a latch, a latch hook or an undercut which cooperates with a complementary counter-securing element on a socket of the bearing coupling. In this way, the achieved final mounting position of the door handle on the bearing coupling can be signaled haptically by engaging the securing element of the electric connector unit on the complementary counter-securing element of the bearing coupling.

In addition, the object according to the invention is solved by a method for producing a handle arrangement (comprising the assembly of the door handle and the mounting of the door handle on the vehicle) for a vehicle, comprising the following steps:
1) inserting an electronic unit into a cavity of a door handle, wherein the electronic unit comprises a carrier unit and an electric connector unit,
2) inserting a casting compound into the cavity so that the casting compound at least partially surrounds the electronic unit,
3) fixing a bearing coupling, which is designed with an electric line, in particular a cable, to the electric connector unit, whereby the door handle is fixed to the vehicle, in particular to a mounting carrier of the vehicle, mechanically, in particular detachably, preferably in a form- and/or force-locking manner, and at the same time the electronic unit is electrically connected to the electric line of the bearing coupling.

By means of the method according to the invention, the same advantages can be achieved as described above in connection with the door handle and/or the handle arrangement according to the invention. These advantages are fully referred to in the present case.

Furthermore, in a method for producing a handle arrangement, the invention may provide that in step 1) inserting the electronic unit into the cavity is at least partially automatic or fully automatic, preferably by means of a robot. Thus, the method can be significantly accelerated and create significant cost advantages.

Furthermore, in a method for producing a handle arrangement, the invention may provide that in step 1) an automatic positioning of the electronic unit is performed by at least one positioning element on the housing, in particular in the form of a positioning rail. Thus, the correctness of the positioning of the electronic unit in the cavity during the arrangement can be ensured.

Furthermore, in a method for producing a handle arrangement, the invention may provide that in step 1) an automatic positioning and/or an automatic sealing of the electronic unit is performed by a fixing unit for a connector housing of the electric connector unit, in particular in the form of a labyrinth guide, and/or in step 3) an additional sealing of the electronic unit is performed by a connector housing of the electric connector unit, in particular by a second elastic sealing element on at least one securing element of the connector housing. In this way, an improved door handle and an improved handle arrangement can be provided, which can provide reliable functionality and extended operation time.

In addition, in a method for producing a handle arrangement, the invention may provide that the method comprises at least one further step:
4) screwing the bearing coupling to a bearing receptacle of the door handle.

Thus, the loss-proof fixing of the door handle to the bearing coupling and thus to the vehicle can be further secured.

Advantageously, the method according to the invention is specifically designed for producing a handle arrangement which can be designed as described above and which can comprise a door handle which can be designed as described above.

Further advantages, features and details of the invention result from the following description in which, with reference to the figures, embodiments of the invention are described in detail.

Figure 2:
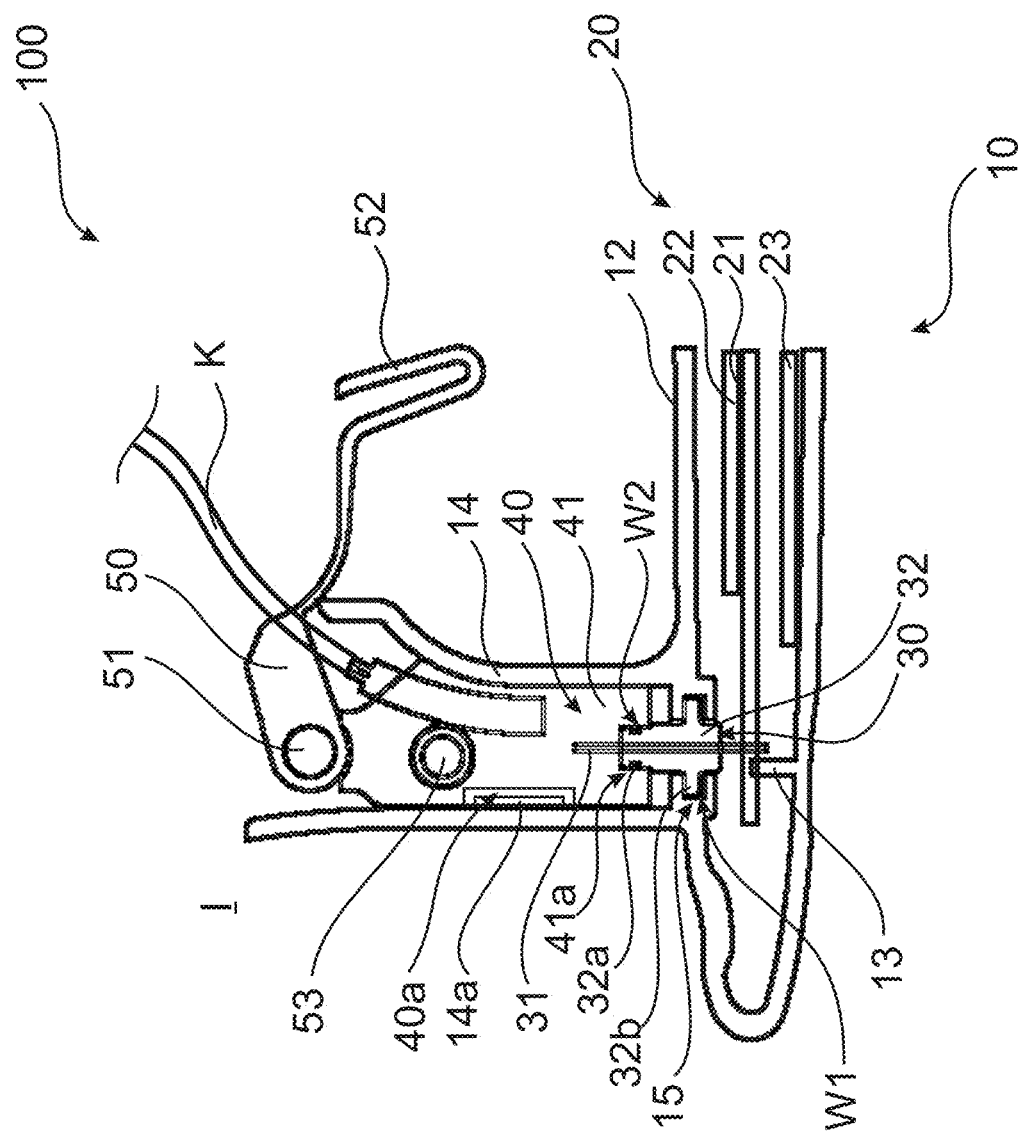
Figure 3:
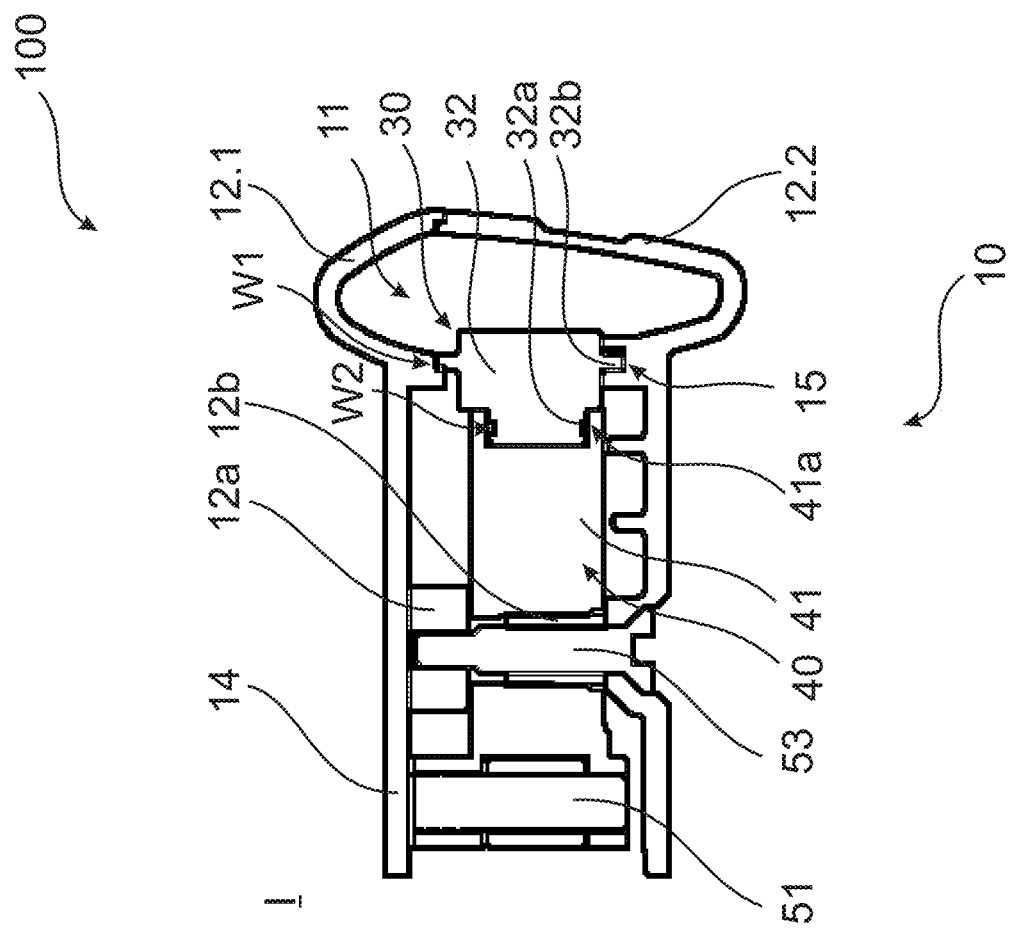
Figure 4:
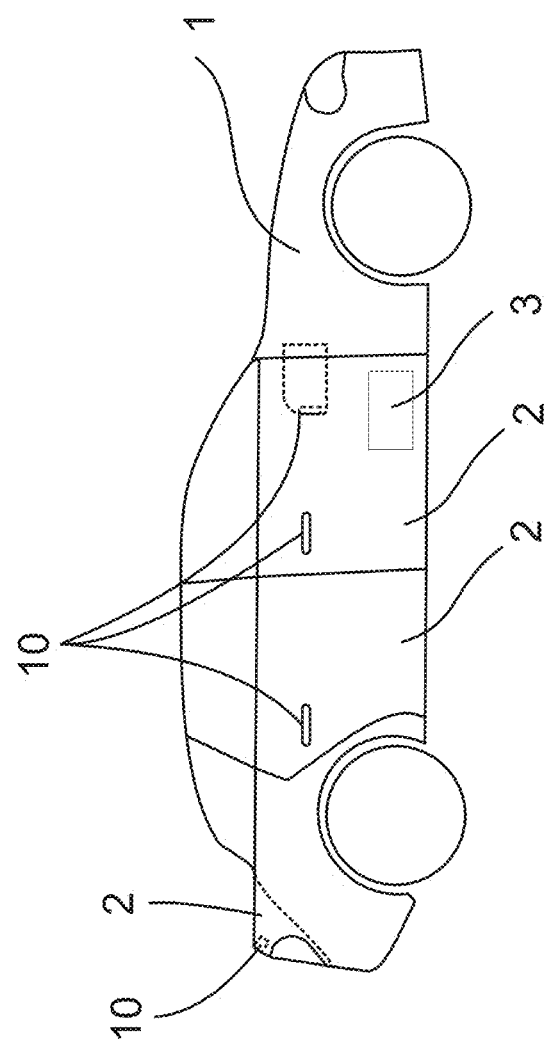
Figure 5:
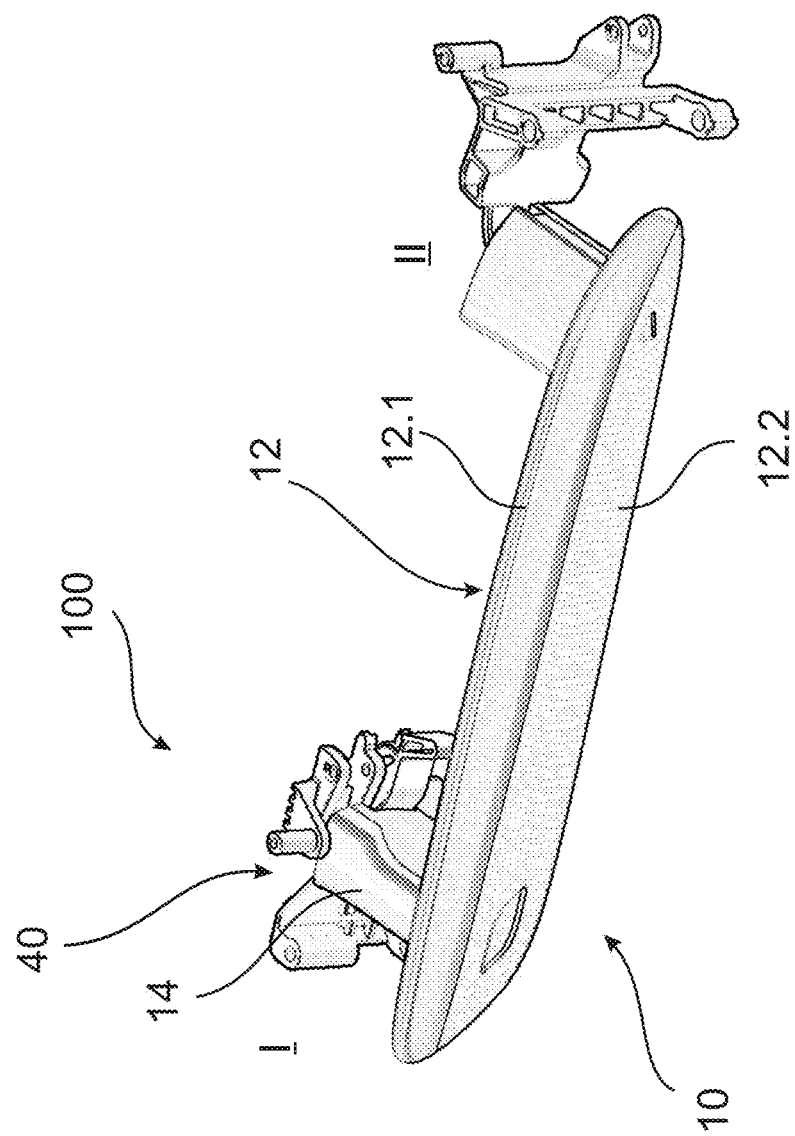
Figure 6:
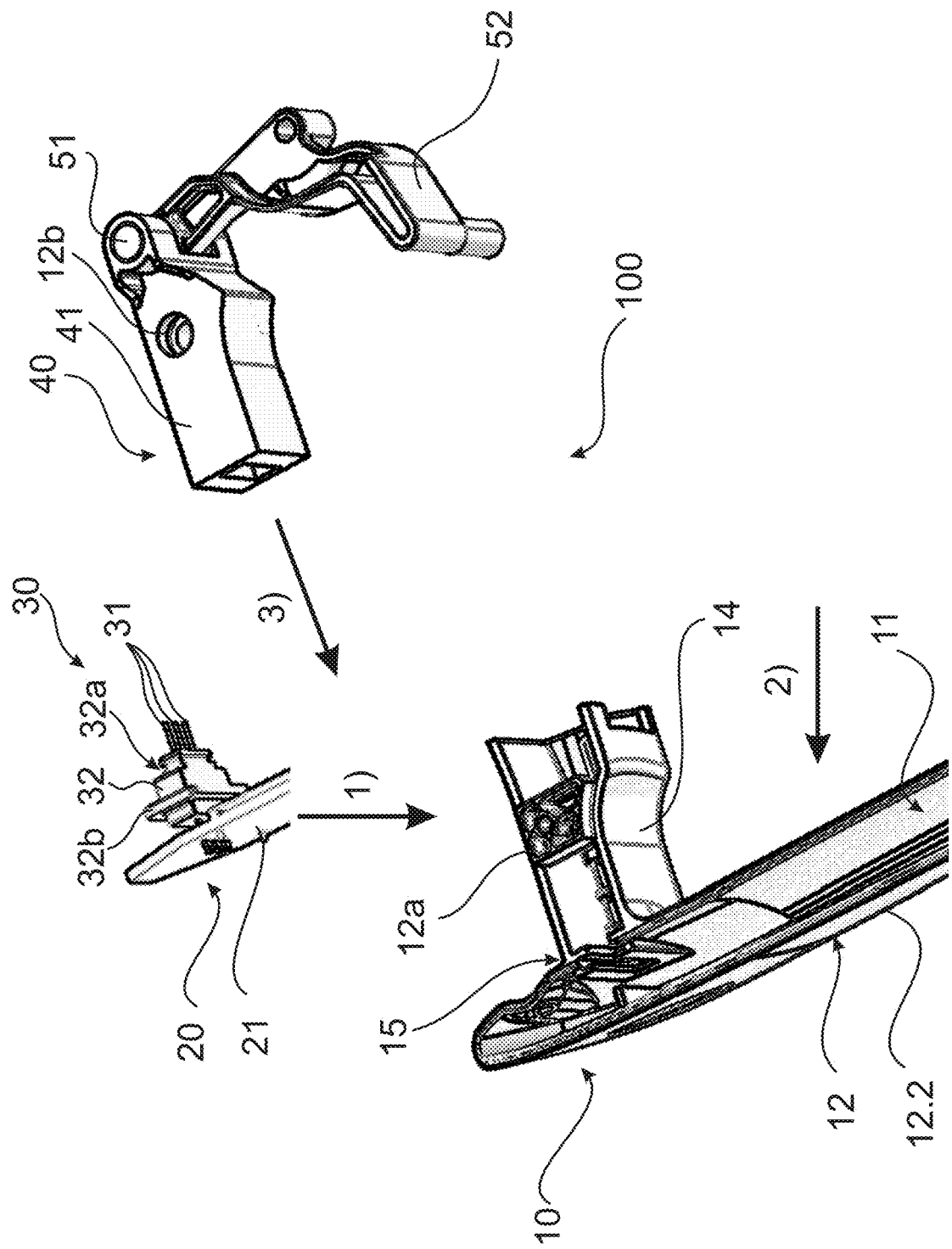
Figure 7:
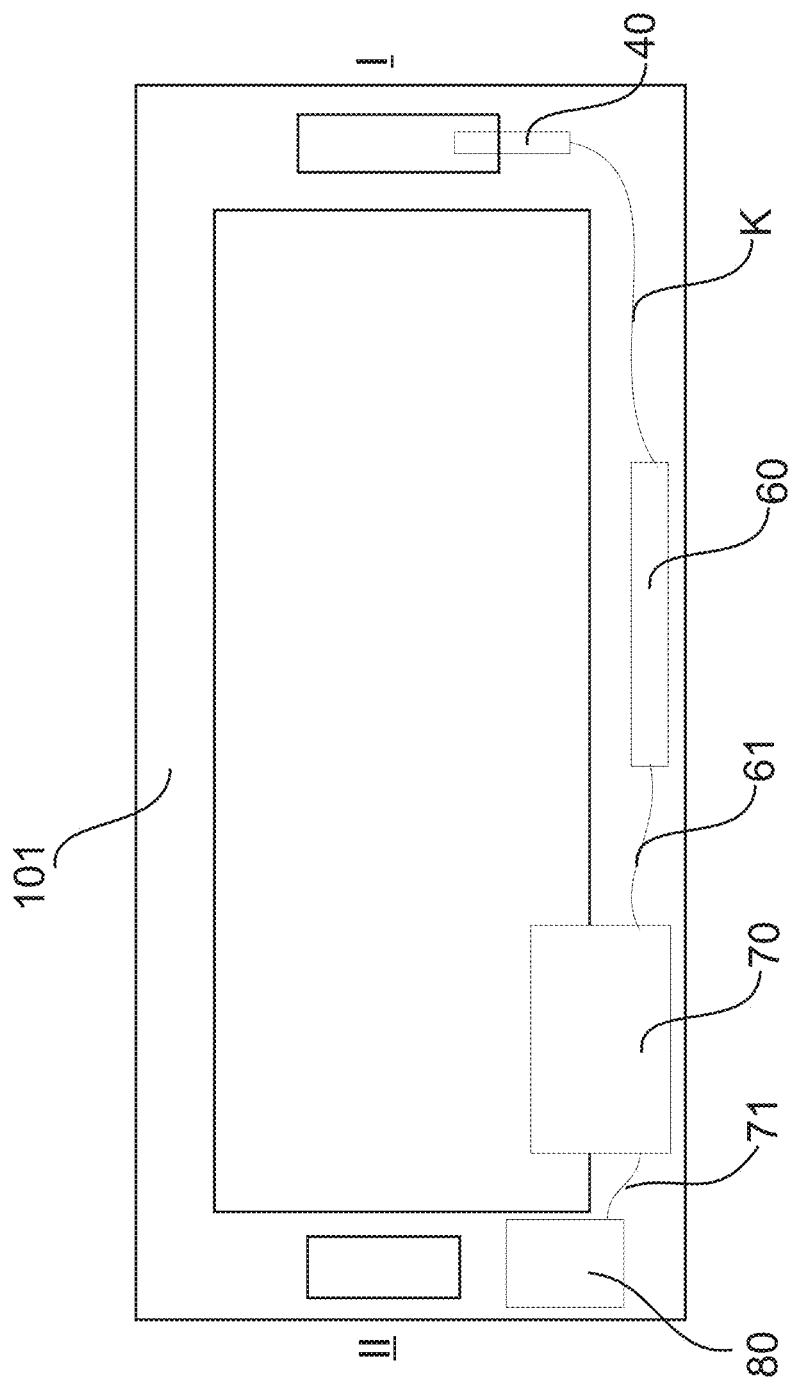

The features mentioned in the claims and in the description may be individually or in any combination essential to the invention. The figures show:

FIG. 1 an exploded view of a bearing arm of a door handle according to the invention and a bearing coupling for the door handle according to the invention, FIG. 2 a schematic view of a bearing arm of a door handle according to the invention and a bearing coupling in the assembled state in a longitudinal section through the door handle, FIG. 3 a schematic view of a bearing arm of a door handle according to the invention and a bearing coupling in an assembled state in a cross-section through the door handle along the bearing arm, FIG. 4 a schematic view of a vehicle with a door handle according to the invention, FIG. 5 a perspective view of a door handle according to the invention in the assembled state, FIG. 6 an exploded view of a door handle according to the invention, and FIG. 7 a schematic view of a vehicle-side mounting carrier for a door handle according to the invention in an exploded view.

In the following figures, identical reference signs are used for the same technical features even from different embodiments.

FIGS. 1 to 3 each show a section of a door handle 10 according to the invention at a first bearing position I before fixing with a bearing coupling 40 in different views. The door handle 10 is designed for a vehicle 1, preferably a motor vehicle, in particular as an external door handle for a movable part 2 of the vehicle 1. The vehicle 1 is shown schematically in FIG. 4.

The door handle 10 comprises the following elements:
a cavity 11, which is at least partially formed by a housing 12 of the door handle 10, and
an electronic unit 20, which is received in the cavity 11, wherein the electronic unit 20 comprises a carrier unit 21, in particular an electric circuit board, such as a printed circuit board or printed circuit,
an electric connector unit 30, which comprises at least one electrically conductive connector element 31, in particular comprising at least one contact pin (see FIG. 2) or several contact pins, e.g. three contact pins (see FIG. 6),
wherein the at least one connector element 31 is fixed in a material-locking manner, in particular soldered, welded or glued, to the carrier unit 21.

In the context of the invention, the door handle 10 may be designed as a flush door handle 10, which can be moved out of the outside of the movable part 2 to reach an operating position which is not shown. In the operating position, the door handle 10 serves to actuate the movable part 2, e.g., to unlock and/or open the movable part 2. To actuate the door handle 10, a force can be exerted on the door handle 10, e.g., a pull and/or push. The door handle 10 can advantageously be provided for a keyless-entry and/or keyless-go security system.

The carrier unit 21 in the sense of the invention is designed to receive electronic components. Furthermore, the carrier unit 21 may also be designed to receive a microprocessor and/or an integrated circuit as well as one or more sensor units 22 and/or one or more conductor tracks.

The at least one electrically conductive connector element 31, in particular in the form of at least one contact pin, is preferably connected to the carrier unit 21 in a material-locking manner, for example by soldering, welding and/or gluing.

As can be seen from FIGS. 2 and 6, the at least one electrically conductive connector element 31 together with the electric connector unit 30 can form a male plug part which is integrated in the door handle 10, in particular in a bearing arm of the door handle 10, e.g. in the form of a bearing receptacle 12. Thus, the door handle 10, as indicated in FIG. 5, can be provided without a cable and can only be electrically connected to an electric line K by mounting the door handle 10 on the vehicle 1, which in turn can lead to another switch 60 and/or to a control unit 70, as indicated in FIG. 7.

As shown in FIG. 6, after arranging the door handle 10 from the outside on the vehicle 1, in particular on the movable part 2 of the vehicle 1, a separate socket 41 can be guided to the connector element 31, seen from the inside with respect to the vehicle 1 or from the inside with respect to the movable part 2 of the vehicle 1, which can be mechanically fixed to the electric connector unit 30 and at the same time electrically connected to the at least one electrically conductive connector element 31.

As shown in FIG. 2, the socket 41 can in turn be designed with an electric line K, e.g. in the form of a cable, which can lead to the vehicle electronics, possibly via another central plug 60 and/or via a control unit 70 on an mounting carrier 101 (see FIG. 7). The mounting of the door handle 10 on the vehicle 1, in particular on the movable part 2 of the vehicle 1, as well as the attachment of the electronic unit 20 with the vehicle electronics 1 can thus be considerably simplified.

Furthermore, the electronic unit 20 and/or the electric connector unit 30 do not need to be handled with a cable from the outset, e.g. when producing the door handle 10, i.e. when inserting the electronic unit 20 and/or the electric connector unit 30 into the cavity 11. The mounting of the electronic unit 20, in particular of the carrier unit 21, and/or the electric connector unit 30 within the cavity 11 of the door handle 10 can thus be considerably simplified. Advantageously, a simple and automated assembly of the door handle, even by a robot, can thus be enabled.

As can be seen in FIGS. 1, 2, 5 and 6, the electric connector unit 20 and/or the electronic unit 20, or the door handle 10 itself, can be wireless. After assembling the door handle 10, a finished wireless door handle 10 can be guided from the outside to the movable part 2 of the vehicle 1 to be mounted on a bearing coupling 40 which can be guided from the inside to the movable part 2 of the vehicle 1. The bearing coupling 40 may in turn comprise an electric line K, in particular a cable, which can be mechanically, in particular detachably, preferably in a form- and/or force-locking manner, fixed to the electric connector unit 30, preferably by an engaging connection 32a, 41a, whereby the electronic unit 20 can be electrically connected to the electric line K, in particular the cable, of the bearing coupling 40.

As indicated in FIG. 2, the carrier unit 21 may comprise at least one conductor track and/or at least one sensor unit 22, which is/are electrically connectable to a socket 41 via the at least one connector element 31. The at least one conductor track and/or the at least one sensor unit 22 can advantageously be designed in the form of a proximity sensor, in particular a capacitive sensor, in order to enable contactless actuation of the door handle 10. Thus, the door handle 10 can form part of keyless-entry and/or keyless-go security system of the vehicle 1.

The electronic unit 20 can also be provided with at least one (not shown) lighting unit, which can be electrically connected to a socket 41 via the at least one connector element 31. The lighting unit can, for example, signal, by certain colors and/or generally by emitting light, certain actuation states of a keyless-entry and/or keyless-go security system of the vehicle 1 and/or the actuation, such as unlocking and/or opening of the movable part 2. In addition, the lighting unit can also emit warning signals if, for example, the at least one sensor unit 22 senses that the user and/or other obstacles, such as curbs, or objects, such as a tree or tree root, are too close to the movable part 2, so that a safe opening of the movable part 2 is not possible.

As further shown in FIGS. 2, 3 and 6, the electric connector unit 30 can comprise a connector housing 32, wherein in particular a receptacle for the at least one connector element 31 is formed in the connector housing 32, so that the at least one connector element 31 can be electrically contacted with an electric line K, in particular a cable, of the bearing coupling 40 by mechanically connecting the connector housing 32 to a socket 41 of a bearing coupling 40.

Furthermore, FIGS. 2, 3 and 6 show that the connector housing 32 of the electric connector unit 30 can comprise at least one securing element 32a in order to connect the connector housing 32 in a form- and/or force-locking manner to the socket 41 of the bearing coupling 40, wherein in particular the at least one securing element 32a can be in the form of a latch, a latch hook or an undercut for a complementary counter-securing element 41a on the socket 41 of the bearing coupling 40.

As indicated in FIG. 2, the connector housing 32 of the electric connector unit 20, in particular at the at least one fuse element 32a, may comprise a second elastic sealing element W2, in order to seal in particular the cavity 11 in addition to a first elastic sealing element W1, which is discussed below.

The connector housing 32 of the electric connector unit 30 can be designed as a plastic component, e.g. as a two-component injection-molded part, preferably made of a fiber-plastic composite. It is also conceivable that the connector housing 32 of the electric connector unit 30 may comprise the at least one connector element 31 as an injected element.

As shown in FIGS. 1 to 3, 5 and 6, the door handle 10 may comprise a bearing arm receptacle 12 for the bearing coupling 40, which in particular comprises a completely closed circumferential contour for the bearing coupling 40, which is preferably adapted to the outer circumference of the bearing coupling 40, and which is preferably O-shaped or essentially rectangular. Together with the door handle 10, the bearing coupling 40 forms a handle arrangement 100 in the sense of the invention.

The bearing arm receptacle 14 can advantageously comprise a mounting element 14a, which is indicated in FIG. 2. The mounting element 14a can be designed in the form of a guiding rail or a guiding engaging element for a complementary counter-mounting element 40a of the bearing coupling 40 in order to receive the bearing coupling 40 in a defined orientation in the bearing arm receptacle 14.

As can also be seen in FIG. 2, the bearing arm receptacle 14 can be designed at such a distance from the outer contour of the electric connector unit 30 that the electric connector unit 30 is enclosed by the bearing arm receptacle 14 in a shell-like manner, and that the bearing arm receptacle 14 and the connector unit 30 form a male plug part in which the socket 41 of a bearing coupling 40 can be detachably fixed, in particular in a form- and/or force-locking manner. In this way, an intuitive mounting of the socket 41 of the bearing coupling 40 in the bearing arm receptacle 14 according to the plug and socket principle is possible.

As further shown in FIGS. 2 and 6, the door handle 10 may comprise a fixing unit 15 for a connector housing 32 of the electric connector unit 30 in the region between the housing 12 and a bearing arm receptacle 14 for a bearing coupling 40. The fixing unit 15 may be designed in the form of a labyrinth guide, which preferably cooperates with a complementary peripheral shoulder 32b of the electric connector unit 30. The labyrinth guide can be used for an easy mounting of the electric connector unit 30 in the housing 12 of the door handle 10, wherein the correct mounting movement and mounting position of the electric connector unit 30 in the housing 12 of the door handle 10 is determined by the labyrinth guide. In addition, the labyrinth guide serves to seal the cavity 11. It is also conceivable that the mounting unit 15 may comprise an additional sealing, in particular within the labyrinth guide, to seal the cavity 11.

As can be seen in FIGS. 2 and 6, the fixing unit 15 can preferably extend along an outer circumference of the connector housing 32 of the electric connector unit 30.

As indicated in FIGS. 1 to 3, 5 and 6, the housing 12 of the door handle 10 may comprise a first shell 12.1 and a second shell 12.2 to allow an easy mounting and/or arrangement and/or positioning of the electronic unit 20, in particular the carrier unit 21, in the cavity 11 of the door handle 10.

The housing 12 can also comprise at least one positioning element 13, e.g. in the form of a positioning rail, for the carrier unit 21, in order to guide the carrier unit 21 in the cavity 11 during mounting and fix it in a correct mounting position.

Within the scope of the invention, a casting compound can be injected into the cavity 11 in order to seal in particular the electronic unit 20, wherein preferably the casting compound surrounds the electronic unit 20 predominantly or completely. For this purpose, the housing 12 of the door handle 10, in particular the first shell 12.1 and/or the second shell 12.2, may comprise an opening (not shown) for injecting a casting compound into the cavity 11.

The housing 12 comprises, in particular in the lower region of the bearing arm receptacle 14 for the bearing coupling 40, preferably below the fixing unit 15 for the connector housing 32 of the electric connector unit 30, a wall W, preferably with a first elastic sealing element W1 (see FIG. 2). The wall W can limit the cavity 11 from the bearing arm receptacle 14 for the bearing coupling 40, preferably with the at least one connector element 31 extending through the wall W from the cavity 11 to the bearing arm receptacle 14 for the bearing coupling 40.

As indicated in FIG. 2, the invention may provide an aperture 23 for the electronic unit 20, which may be arranged in particular from the inside on an outside of the door handle 10, e.g. a side facing away from the movable part 2, in order to shield the at least one sensor unit 22 of the electronic unit 20 and/or to form a detection region of the at least one sensor unit 22. The aperture 23 may be electrically conductive and/or metallic and/or be formed as a coating, e.g. a chromium coating, on the outside of the door handle 10. In addition, it is conceivable that the aperture 23 can be electrically connected to the electronic unit 20 in order to serve as a sensor unit itself.

FIGS. 6 and 7 can be used to explain the inventive method of producing a handle arrangement 100 (comprising the assembly of the door handle 10 and the mounting of the door handle 10 on the vehicle 1) for a vehicle 1. The method according to the invention comprises the following steps, which are indicated in FIG. 6:

1) inserting an electronic unit 20 into a cavity 11 of a door handle 10, wherein the electronic unit 20 comprises a carrier unit 21 and an electric connector unit 30,
2) inserting a casting compound into the cavity 11 so that the casting compound at least partially surrounds the electronic unit 20,
3) fixing a bearing coupling 40, which is designed with an electric line K, in particular a cable, to the electric connector unit 30, whereby the door handle 10 is fixed to the vehicle 1, in particular to a mounting carrier 101 of the vehicle 1, mechanically, in particular detachably, preferably in a form- and/or force-locking manner, and at the same time the electronic unit 20 is electrically connected to the electric line K of the bearing coupling 40.

In step 1), the insertion of the electronic unit 20 into the cavity 11 can be at least partially automatic or fully automatic, preferably by a robot.

Furthermore, in step 1) an automatic positioning of the electronic unit 20 can be performed by at least one positioning element 13 on the housing 12, in particular in the form of a positioning rail.

Furthermore, in step 1) an automatic positioning and/or an automatic sealing of the electronic unit 20 can be performed by a fixing unit 15 for a connector housing 32 of the electric connector unit 30, in particular in the form of a labyrinth guide. For this purpose, a first sealing element W1 can be provided on a lower wall of the fixing unit 15 and, if necessary, an additional sealing can be provided within the fixing unit 15.

In step 3) an additional sealing of the electronic unit 20 can again be achieved by a connector housing 32 of the electric connector unit 30, in particular by a second elastic sealing element W2 on at least one securing element 32a of the connector housing 32.

In addition, in a method for producing a handle arrangement, the invention may provide that the method comprises at least one further step:

4) screwing, e.g. with a screw 53, the bearing coupling 40 to a bearing receptacle 14 of the door handle 10.

To receive the screw 53, a counter-screwing means 12a (to tighten the screw 53 against the housing 12) can be provided on the housing 12, in particular on the second shell 12.2 of the housing 12 of the door handle 10 and a screw guide 12b (in the manner of a dowel) can be provided in the bearing coupling 40 (see FIGS. 3 and 6).

As further indicated in FIGS. 2 and 6, a bearing shaft 51 on a mounting arm 50 can be provided for the bearing coupling 40, which can be used for, e.g., rotatable fixing of the bearing coupling 40 to the mounting carrier 101 of the vehicle 1. The mounting arm 50 can also comprise a functional element 52, which can, for example, lead to a lock which is not shown.

Finally, FIG. 7 shows a corresponding mounting carrier 101 from the rear on which further components can be supported, such as a central plug 60, if necessary with a cable 61 to a control unit 70, the control unit 70, if necessary with a cable 71 to a motor 80. The motor 80 can be used to move the door handle 10 between a rest position and an operating position.

The above explanation of the embodiments describes the present invention exclusively in the context of examples. Of course, individual features of the embodiments can be freely combined with each other, if technically reasonable, without leaving the scope of the present invention.

LIST OF REFERENCE SIGNS 1 vehicle
2 movable part
3 vehicle electronics
10 door handle
11 cavity
12 housing
12a counter-screwing means
12b screw guide
12.1 first shell
12.2 second shell
13 positioning element
14 bearing arm receptacle
14a mounting element
15 fixing unit
20 electronic unit
21 carrier unit
22 sensor unit
23 aperture
30 electric connector unit
31 connector element
32 connector housing
32a securing element
32b shoulder
40 bearing coupling
40a counter-mounting element
41 socket
41a counter-securing element
50 mounting arm
51 bearing shaft
52 functional element
53 screw
60 central plug
61 cable
70 control unit
71 cable
80 motor
100 handle arrangement
101 mounting carrier
K electric line
W Wall
W1 sealing element
I first bearing position
II second bearing position

The invention claimed is:

1. A door handle for a vehicle comprising:
a cavity which is at least partially formed by a housing of the door handle;
an electronic unit which is received in the cavity, wherein the electronic unit comprises a carrier unit;
a bearing arm receptacle configured to receive a bearing coupling; and
an electric connector unit which comprises at least one electrically conductive connector element, wherein the at least one connector element is fixed to the carrier unit in a material-locking manner,
wherein the bearing arm receptacle is at such a distance from an outer contour of the electric connector unit that the electric connector unit is enclosed by the bearing arm receptacle,
wherein the bearing arm receptacle, the electric connector unit, and the at least one electrically conductive connector element form a plug part that is integrated in the door handle and that is configured to detachably connect to and electrically contact a socket of the bearing coupling, and
wherein, in a finished, assembled, and uninstalled state of the door handle, the door handle does not include any cables or wires extending outside of the door handle and the electric connector unit and the at least one electrically conductive connector element do not extend outside of the door handle.

2. The door handle according to claim 1, wherein
at least the carrier unit is an electric circuit board, or
the carrier unit comprises at least one conductor track or at least one sensor unit, which is electrically connectable to a socket via the at least one connector element.

3. The door handle according to claim 1, wherein
at least the electronic unit comprises at least one lighting unit which is electrically connectable to a socket via the at least one connector element, or
the door handle is a flush door handle.

4. The door handle according to claim 1, wherein
at least the electric connector unit comprises a connector housing forming part of the plug part.

5. The door handle according to claim 1, wherein
at least a connector housing of the electric connector unit comprises at least one securing element in order to connect the connector housing to a socket of a bearing coupling in at least a form- or force-locking manner, or
a connector housing of the electric connector unit forms part of the plug part and comprises a second elastic sealing element.

6. The door handle according to claim 1, wherein
at least a connector housing of the electric connector unit is a plastic component, or
a connector housing of the electric connector unit forms part of the plug part and comprises the at least one connector element as an injected element.

7. The door handle according to claim 6, wherein
at least the bearing arm receptacle comprises a mounting element for a complementary counter-mounting element of the bearing coupling in order to receive the bearing coupling in a defined orientation in the bearing arm receptacle, or
the plug part is a male plug part configured to detachable receive and electrical contact the socket of the bearing coupling.

8. The door handle according to claim 1, wherein the door handle comprises a fixing unit for a connector housing of the electric connector unit in the region between the housing and a bearing arm receptacle for a bearing coupling, wherein the connector housing forms part of the plug part.

9. The door handle according to claim 8, wherein
at least the fixing unit comprises a labyrinth guide, or
the fixing unit comprises an additional sealing to seal the cavity.

10. The door handle according to claim 1, wherein
at least the housing of the door handle comprises a first shell and a second shell, or
the housing comprises at least one positioning element for the carrier unit in order to fix the carrier unit in the cavity.

11. The door handle according to claim 1, wherein
at least the housing seals the cavity, or
the housing comprises a wall.

12. The door handle according to claim 1, wherein
at least a casting compound is injected into the cavity, or
the housing of the door handle comprises an opening for injecting a casting compound into the cavity.

13. The door handle according to claim 1, wherein an aperture is provided for the electronic unit.

14. A handle arrangement for a vehicle, comprising:
a door handle, comprising
a cavity which is at least partially formed by a housing of the door handle,
an electronic unit which is received in the cavity, wherein the electronic unit comprises a carrier unit,
a bearing arm receptacle,
an electric connector unit which comprises at least one electrically conductive connector element, wherein the electric connector unit, and
a bearing coupling configured to fix the door handle on the vehicle, the bearing coupling comprising
a bearing coupling plug part having one end connected to an electric line and a second end that is detachably connected to the door handle plug part, and
wherein the bearing coupling is mechanically fixed and electrically connected to the electric connector unit of the door handle,
wherein the bearing arm receptacle is configured to receive the bearing coupling,
wherein the bearing arm receptacle is at such a distance from an outer contour of the electric connector unit that the electric connector unit is enclosed by the bearing arm receptacle, and
wherein the bearing arm receptacle, the electric connector unit, and the at least one electrically conductive connector element forms a plug part that is integrated in the door handle and that is configured to detachably connect to and electrically contact a socket of the bearing coupling.

15. The handle arrangement according to claim 14, wherein
the bearing arm receptacle comprises a mounting element which cooperates with a complementary coupling element of the bearing coupling in order to receive the bearing coupling in a defined orientation in the bearing arm receptacle.

16. The handle arrangement according to claim 14, wherein
the plug part is a male plug part in which a socket of the bearing coupling is detachably received and electrically contacted, or
a connector housing of the electric connector unit comprises at least one securing element in order to connect the connector housing to a socket of the bearing coupling in at least a form- or force-locking manner.

17. A method for producing a handle arrangement for a vehicle, comprising the following steps:
1) Inserting an electronic unit into a cavity a of a door handle, wherein the electronic unit comprises a carrier unit and an electric connector unit, wherein the electric connector unit includes at least one electrically conductive connector element, wherein the door handle includes a bearing arm receptacle, wherein the bearing arm receptacle is at such a distance from an outer contour of the electric connector unit that the electric connector unit is enclosed by the bearing arm receptacle, and wherein bearing arm receptacle, the electric connector unit, and the at least one electrically conductive connector element form a door handle plug part that is integrated in the door handle;
2) Inserting a casting compound into the cavity so that the casting compound at least partially surrounds the electronic unit;
3) Inserting a bearing coupling through a door of the vehicle, wherein the bearing coupling includes a bearing coupling plug part having one end connected to an electric line to the electric connector unit; and
affixing the door handle to the bearing coupling by inserting the bearing coupling inside of the bearing arm receptacle so that a second end of the bearing coupling plug part is detachably connected to the door handle plug part affixed inside of the cavity of the door handle and so that the door handle is mechanically fixed to the vehicle and the electronic unit is electrically connected to the electric line of the bearing coupling.

18. The method according to claim 17, wherein
at least in step 1) inserting the electronic unit into the cavity is at least partially automatic or fully automatic,
in step 1) an automatic positioning of the electronic unit is performed by at least one positioning element on the housing,
in step 1) an automatic positioning and/or an automatic sealing of the electronic unit is performed by a fixing a unit for a connector housing of the electric connector unit, or
in step 3) an additional sealing of the electronic unit is performed by a connector housing of the electric connector unit, wherein the connector housing is part of the door handle plug part.

19. The method according to claim 17, further comprising:
   4) Screwing the bearing coupling to a bearing receptacle of the door handle.

* * * * *